US008797102B2

(12) United States Patent
Hirooka

(10) Patent No.: US 8,797,102 B2
(45) Date of Patent: Aug. 5, 2014

(54) POWER AMPLIFYING CIRCUIT AND HIGH-FREQUENCY MODULE

(71) Applicant: Murata Manufacturing Co., Ltd., Nagaokakyo (JP)

(72) Inventor: Hiroyuki Hirooka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 45 days.

(21) Appl. No.: 13/656,885

(22) Filed: Oct. 22, 2012

(65) Prior Publication Data

US 2013/0113560 A1     May 9, 2013

(30) Foreign Application Priority Data

Nov. 9, 2011    (JP) ................... 2011-245131

(51) Int. Cl.
     *H03F 3/191*      (2006.01)
(52) U.S. Cl.
     USPC ............................. 330/302; 330/53; 330/310
(58) Field of Classification Search
     USPC ........................................... 330/302, 53, 310
     IPC ..................................................... H03F 3/191
     See application file for complete search history.

(56) References Cited

U.S. PATENT DOCUMENTS

| | | | | |
|---|---|---|---|---|
| 3,852,669 A | * | 12/1974 | Bowman et al. | ............ 455/117 |
| 4,042,887 A | * | 8/1977 | Mead et al. | .................. 330/53 |
| 6,262,636 B1 | * | 7/2001 | McLain et al. | ............... 333/109 |
| 6,498,925 B1 | * | 12/2002 | Tauchi | ..................... 455/115.1 |
| 7,546,089 B2 | * | 6/2009 | Bellantoni | ...................... 455/73 |
| 2006/0267688 A1 | | 11/2006 | Tanoue et al. | |
| 2010/0201346 A1 | | 8/2010 | You | |

FOREIGN PATENT DOCUMENTS

| | | |
|---|---|---|
| JP | 10-290108 A | 10/1998 |
| JP | 2010-068078 A | 3/2010 |

OTHER PUBLICATIONS

Official Communication issued in corresponding European Patent Application No. 12190502.0, mailed on Apr. 5, 2013.
Official Communication issued in corresponding European Patent Application No. 12190502.0, mailed on Feb. 21, 2013.

\* cited by examiner

*Primary Examiner* — Patricia Nguyen
(74) *Attorney, Agent, or Firm* — Keating & Bennett, LLP

(57) ABSTRACT

A high-frequency module including a power amplifying circuit includes a high-frequency power amplifying element, a matching circuit, and a driving power-supply circuit. The high-frequency power amplifying element includes a high-frequency amplifying circuit and a directional coupler. A first end of a main line of the directional coupler is connected to an output terminal of a latter-stage amplifying circuit of the high-frequency amplifying circuit. A second end of the main line of the directional coupler is connected through an output matching circuit to a high-frequency signal output terminal of the high-frequency power amplifying element. The output terminal of the latter-stage amplifying circuit is also connected to a second driving power-supply voltage application terminal of the high-frequency power amplifying element. The second driving power-supply voltage application terminal is connected to the high-frequency signal output terminal by a connecting conductor.

17 Claims, 5 Drawing Sheets

POWER AMPLIFYING CIRCUIT AND HIGH-FREQUENCY MODULE

BACKGROUND OF THE INVENTION

1. Field of the Invention

The present invention relates to a power amplifying circuit that amplifies a high-frequency signal, and also to a high-frequency module that includes the power amplifying circuit.

2. Description of the Related Art

As front-end modules for communication terminals, various types of high-frequency modules have been devised which include a power amplifying circuit that amplifies a high-frequency signal.

Japanese Unexamined Patent Application Publication No. 2010-68078 describes a high-frequency amplifying circuit in which output power is controlled through feedback control by a directional coupler. The high-frequency amplifying circuit includes a power amplifier that amplifies a high-frequency signal. An output terminal of the power amplifier is connected to the directional coupler, which includes a main line and a subline coupled to each other. An output signal from the power amplifier is transmitted through the main line and output to a load, such as an antenna. A part of the output signal transmitted through the main line propagates through the subline. The signal transmitted through the subline is detected. In accordance with a result of the detection, an amplification factor of the power amplifier is controlled.

In the configuration described above, where every output signal from the power amplifier passes through the directional coupler, power propagates through the subline depending on the degree of coupling between the main line and the subline in the directional coupler. Since power propagating through the subline is not output from the high-frequency amplifying circuit to a load, such as an antenna, output power from the high-frequency amplifying circuit may be reduced depending on the degree of coupling of the directional coupler.

SUMMARY OF THE INVENTION

Preferred embodiments of the present invention provide a power amplifying circuit that prevents a reduction in output power even when feedback control is performed.

According to a preferred embodiment of the present invention, a power amplifying circuit includes a high-frequency amplifying circuit configured to amplify an input high-frequency signal by a predetermined amplification factor and output the amplified high-frequency signal; a directional coupler including a main line connected at a first end thereof to an output terminal of the high-frequency amplifying circuit and connected at a second end thereof to a signal output terminal; and a connecting conductor configured to bypass the directional coupler and connect the output terminal of the high-frequency amplifying circuit to the second end of the main line.

With this configuration, the high-frequency signal amplified by the high-frequency amplifying circuit is output from both a path passing through the directional coupler and a path bypassing the directional coupler. This significantly reduces a loss of signal in the directional coupler and prevents a reduction in output power.

In the power amplifying circuit described above, a driving power-supply voltage application terminal in a final-stage amplifying element of the high-frequency amplifying circuit is preferably connected to the output terminal of the high-frequency amplifying circuit, and the connecting conductor is preferably connected to the driving power-supply voltage application terminal.

This configuration is a specific example of a connection configuration in which the connecting conductor is connected to the high-frequency amplifying circuit. The high-frequency amplifying circuit includes multiple stages of amplifying elements. For example, if an npn-type transistor is used as the final-stage amplifying element, a collector terminal of the npn-type transistor serves both as an output terminal and a driving power-supply voltage application terminal (to apply a power-supply voltage for driving the npn-type transistor). Therefore, by connecting the connecting conductor to the driving power-supply voltage application terminal, it is possible to provide a path through which an amplified high-frequency signal can be output to the outside without being passed through the directional coupler. The connecting conductor can thus be realized with a simple configuration.

Preferably, the power amplifying circuit further includes a first matching circuit connected to the second end of the main line.

In this configuration, adding the first matching circuit allows impedance matching to be performed between the power amplifying circuit and the subsequent-stage circuit. Thus, a high-frequency signal can be transmitted with low loss from the power amplifying circuit to the subsequent-stage circuit.

Preferably, the power amplifying circuit further includes a second matching circuit connected between the second end of the main line and a node between the second end and the connecting conductor.

This configuration allows impedance matching to be performed only on a high-frequency signal passing through the directional coupler. Thus, impedance matching can be performed such that a high-frequency signal from a path that passes through the directional coupler and a high-frequency signal from a path that bypasses the directional coupler are combined together without being cancelled out at the node.

In the power amplifying circuit described above, the first matching circuit preferably includes a first capacitor connected in series to a signal transmission line.

In this configuration, a direct-current voltage applied to the high-frequency amplifying circuit is blocked by the first capacitor and is not transmitted to the subsequent-stage circuit.

In the power amplifying circuit described above, the first matching circuit may include an inductor connected in series to the first capacitor, and a second capacitor connected between a ground potential and a node between the first capacitor and the inductor.

This configuration is a specific example of a configuration of the first matching circuit. In this configuration, where the inductor and the first capacitor are connected in series and the second capacitor is connected to the node between them, a wider range of impedance matching than in the case with a single inductor and a single capacitor can be achieved.

According to a preferred embodiment of the present invention, a high-frequency module includes a high-frequency power amplifying element including a high-frequency amplifying circuit configured to amplify an input high-frequency signal by a predetermined amplification factor and output the amplified high-frequency signal, and a substrate on which the high-frequency power amplifying element is mounted. In the high-frequency module, the high-frequency power amplifying element preferably includes a directional coupler including a main line connected at a first end thereof to an output terminal of the high-frequency amplifying circuit and connected at a second end thereof to a signal output terminal of the high-frequency power amplifying element, a first mounting terminal to apply a driving power-supply voltage to the high-frequency amplifying circuit, and a second mounting terminal being the signal output terminal. The substrate includes a connecting conductor configured to connect the first mounting terminal to the second mounting terminal.

This configuration is a configuration of the high-frequency module including the power amplifying circuit described above. The first mounting terminal to apply a driving power-supply voltage to the high-frequency amplifying circuit and the second mounting terminal corresponding to the second end of the directional coupler are connected to each other by the connecting conductor located on the substrate. This makes it possible to easily realize a configuration in which a high-frequency signal that passes through the directional coupler and a high-frequency signal that bypasses the directional coupler are combined together and output.

In the high-frequency module described above, the first mounting terminal and the second mounting terminal are preferably adjacent to each other in the high-frequency power amplifying element, and the connecting conductor that connects the first mounting terminal to the second mounting terminal is preferably substantially linear.

In this configuration, the first mounting terminal that applies a driving power-supply voltage to the high-frequency amplifying circuit and the second mounting terminal corresponding to the second end of the directional coupler are located close to each other and are connected by the connecting conductor, which preferably is substantially linear in shape. Thus, without taking up much space, it is possible to easily realize a configuration in which a high-frequency signal that passes through the directional coupler and a high-frequency signal that bypasses the directional coupler are combined together and output.

According to various preferred embodiments of the present invention, a reduction in output power can be prevented even when feedback control is performed. Thus, it is possible to improve power added efficiency while controlling output power with a high degree of accuracy.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
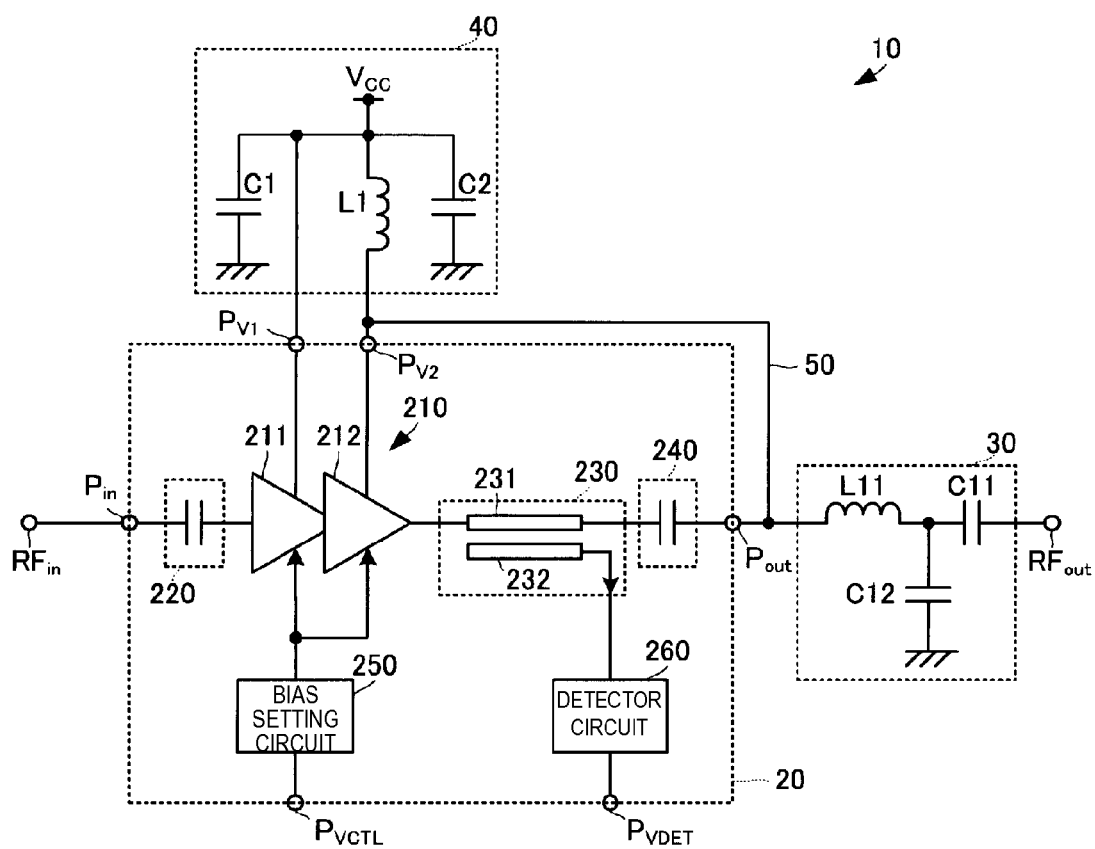
FIG. 1 is a circuit diagram of a high-frequency module including a power amplifying circuit according to a first preferred embodiment of the present invention.

A power amplifying circuit according to a first preferred embodiment of the present invention and a high-frequency module including the power amplifying circuit as a circuit configuration will now be described with reference to the drawings. FIG. 1 is a circuit diagram of a high-frequency module including a power amplifying circuit according to the first preferred embodiment of the present invention.

The high-frequency module 10 includes a high-frequency power amplifying element 20, a matching circuit 30, and a driving power-supply circuit 40. The high-frequency power amplifying element 20 includes a high-frequency amplifying circuit 210, an input matching circuit 220, a directional coupler 230, an output matching circuit 240 corresponding to a second matching circuit of a preferred embodiment of the present invention, a bias setting circuit 250, and a detector circuit 260.

The high-frequency amplifying circuit 210 includes a former-stage amplifying circuit 211 and a latter-stage amplifying circuit 212.

An input terminal of the former-stage amplifying circuit 211 is connected through the input matching circuit 220 to a high-frequency signal input terminal $P_{in}$ of the high-frequency power amplifying element 20. The high-frequency signal input terminal $P_{in}$ serves as a high-frequency signal input terminal $RF_{in}$ of the high-frequency module 10.

Element values of the input matching circuit 220 are set such that impedance matching is performed between an input impedance of the high-frequency amplifying circuit 210 (or of the former-stage amplifying circuit 211) and an output impedance of an external preceding-stage circuit connected to the high-frequency signal input terminal $P_{in}$ and configured to apply a high-frequency signal to the high-frequency module 10. For example, the input matching circuit 220 preferably includes a capacitor connected between the former-stage amplifying circuit 211 and the high-frequency signal input terminal $P_{in}$.

The directional coupler 230 is connected to an output terminal of the high-frequency amplifying circuit 210, that is, to an output terminal of the latter-stage amplifying circuit 212. The directional coupler 230 includes a main line 231 and a subline 232. The main line 231 and the subline 232 are arranged to be electromagnetically coupled to each other with a predetermined degree of coupling at a frequency of a high-frequency signal. A first end of the main line 231 is connected to the output terminal of the high-frequency amplifying circuit 210. A second end of the main line 231 is connected through the output matching circuit 240 to a high-frequency signal output terminal $P_{out}$ of the high-frequency power amplifying element 20.

Element values of the output matching circuit 240 are set such that an impedance at the high-frequency signal output terminal $P_{out}$ is properly set to achieve desired output characteristics. The output matching circuit 240 preferably includes, for example, a capacitor connected between the second end of the main line 231 and the high-frequency signal output terminal $P_{out}$.

A first end of the subline 232 of the directional coupler 230 is grounded. In other words, the first end of the subline 232 is connected to a ground potential (not shown). A second end of the subline 232 is connected to the detector circuit 260, which is connected to a detected signal output terminal $P_{VDET}$ of the high-frequency power amplifying element 20.

The bias setting circuit 250 is connected to the former-stage amplifying circuit 211 and the latter-stage amplifying circuit 212. At the same time, the bias setting circuit 250 is connected to a bias input terminal $P_{VCTL}$ of the high-frequency power amplifying element 20. The driving power-supply circuit 40 outside the high-frequency power amplifying element 20 is connected to the former-stage amplifying circuit 211 through a first driving power-supply voltage application terminal $P_{V1}$ of the high-frequency power amplifying element 20. At the same time, the driving power-supply circuit 40 outside the high-frequency power amplifying element 20 is connected to the latter-stage amplifying circuit 212 through a second driving power-supply voltage application terminal $P_{V2}$ of the high-frequency power amplifying element 20.

The driving power-supply circuit 40 includes a voltage source that supplies a driving power-supply voltage $V_{cc}$ to drive the high-frequency amplifying circuit 210, an inductor L1, and capacitors C1 and C2. The voltage source is connected to the first driving power-supply voltage application terminal $P_{V1}$. At the same time, the voltage source is connected through the inductor L1 to the second driving power-supply voltage application terminal $P_{V2}$. A node between the voltage source and the first driving power-supply voltage application terminal $P_{V1}$ is grounded by the capacitor C1. A node between the voltage source and the inductor L1 is grounded by the capacitor C2.

The second driving power-supply voltage application terminal $P_{V2}$ connected to the latter-stage amplifying circuit 212 and the high-frequency signal output terminal $P_{out}$ are short-circuited by a connecting conductor 50. The connecting conductor corresponds to a "connecting conductor" of a preferred embodiment of the present invention.

Figure 2:
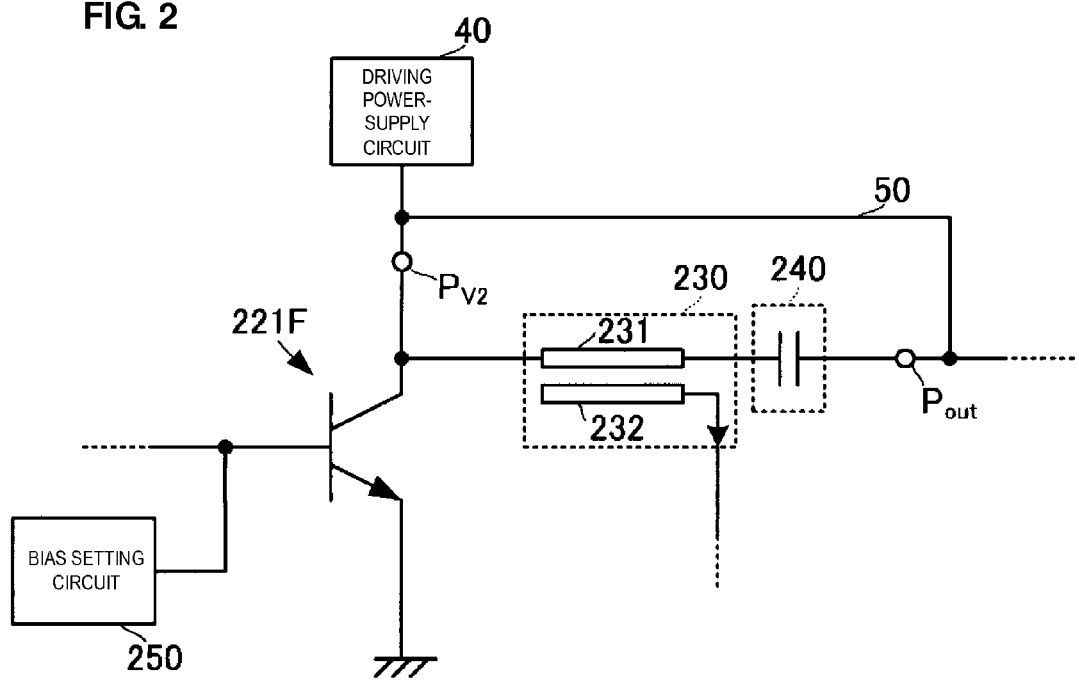
FIG. 2 illustrates a connection configuration of a final stage of a high-frequency amplifying circuit of the power amplifying circuit according to the first preferred embodiment of the present invention.

Specifically, the connecting conductor 50 is placed as illustrated in FIG. 2. FIG. 2 illustrates a connection configuration of a final stage of the high-frequency amplifying circuit 210 of the power amplifying circuit according to the first preferred embodiment of the present invention. To make the characteristics of various preferred embodiments of the present invention easier to understand, FIG. 2 illustrates a minimum circuit configuration, which is applicable, for example, to a configuration that further includes a buffer transistor.

A final-stage transistor 221F (corresponding to a "final-stage amplifying element" of a preferred embodiment of the present invention) that is included in the latter-stage amplifying circuit 212 is an npn-type transistor and is emitter-grounded. A base of the final-stage transistor 221F is connected to an output terminal of the former-stage amplifying circuit 211. The bias setting circuit 250 is connected to the base of the final-stage transistor 221F.

A collector of the final-stage transistor 221F is connected through the second driving power-supply voltage application terminal $P_{V2}$ to the driving power-supply circuit 40, and is also connected to the first end of the main line 231 of the directional coupler 230. The second end of the main line 231 is connected through the output matching circuit 240 to the high-frequency signal output terminal $P_{out}$. The connecting conductor 50 connects the node between the driving power-supply circuit 40 and the second driving power-supply voltage application terminal $P_{V2}$ to the high-frequency signal output terminal $P_{out}$.

The matching circuit 30 is connected to the high-frequency signal output terminal $P_{out}$ of the high-frequency power amplifying element 20. The matching circuit 30 corresponds to a "first matching circuit" of the present invention. One end of the matching circuit 30 is connected to the high-frequency signal output terminal $P_{out}$ of the high-frequency power amplifying element 20. The other end of the matching circuit 30 serves as a high-frequency signal output terminal $RF_{out}$ of the high-frequency module 10. The matching circuit 30 includes a series circuit formed by an inductor L11 and a capacitor C11. The inductor L11 is connected to the high-frequency signal output terminal $P_{out}$, and the capacitor C11 is connected to the high-frequency signal output terminal $RF_{out}$. A node between the inductor L11 and the capacitor C11 is grounded through a capacitor C12. The capacitor C11 corresponds to a "first capacitor" of a preferred embodiment of the present invention, and the capacitor C12 corresponds to a "second capacitor" of a preferred embodiment of the present invention. Each element value of the matching circuit 30 is set such that impedance matching is performed between the high-frequency signal output terminal $P_{out}$ of the high-frequency power amplifying element 20 and the subsequent-stage circuit connected to the high-frequency signal output terminal $RF_{out}$ of the high-frequency module 10.

With the capacitor C11, it is possible to suppress the direct-current driving power-supply voltage $V_{cc}$ applied through the connecting conductor 50. Thus, the direct-current driving power-supply voltage $V_{cc}$ applied to the high-frequency module 10 can be prevented from being applied through the connecting conductor 50 to the subsequent-stage circuit connected to the high-frequency module 10.

The high-frequency module 10 having the above-described configuration operates as follows when a high-frequency signal is input to the high-frequency module 10.

A high-frequency signal is input, through the high-frequency signal input terminal $RF_{in}$ of the high-frequency module 10 and the high-frequency signal input terminal $P_{in}$ of the high-frequency power amplifying element 20, to the former-stage amplifying circuit 211 of the high-frequency amplifying circuit 210. With the input matching circuit 220, the high-frequency signal can be input to the former-stage amplifying circuit 211 with low loss.

The former-stage amplifying circuit 211 amplifies the high-frequency signal by an amplification factor corresponding to the driving power-supply voltage $V_{cc}$ from the driving power-supply circuit 40 and a bias voltage from the bias setting circuit 250, and outputs the amplified high-frequency signal to the latter-stage amplifying circuit 212.

The latter-stage amplifying circuit 212 amplifies the high-frequency signal from the former-stage amplifying circuit 211 by an amplification factor corresponding to the driving power-supply voltage $V_{cc}$ from the driving power-supply circuit 40 and a bias voltage from the bias setting circuit 250, and outputs the amplified high-frequency signal from the collector of the final-stage transistor 221F. Hereinafter, a high-frequency signal amplified by the high-frequency amplifying circuit 210 and output from the collector of the final-stage transistor 221F will be referred to as a "post-amplification high-frequency signal".

The post-amplification high-frequency signal is transmitted not only to the main line 231 of the directional coupler 230, but also to the connecting conductor 50 through the second driving power-supply voltage application terminal $P_{V2}$. Hereinafter, a post-amplification high-frequency signal that passes through the main line 231 of the directional coupler 230 will be referred to as a "first post-amplification high-frequency signal", and a post-amplification high-frequency signal that passes through the connecting conductor 50 will be referred to as a "second post-amplification high-frequency signal".

Through coupling between the main line 231 and the subline 232, the directional coupler 230 causes a portion of the first post-amplification high-frequency signal transmitted through the main line 231 to propagate through the subline 232. Thus, the first post-amplification high-frequency signal is partially lost in the directional coupler 230 and transmitted to the output matching circuit 240. The first post-amplification high-frequency signal is phase-adjusted by the output matching circuit 240 and output to the high-frequency signal output terminal $P_{out}$ of the high-frequency power amplifying element 20.

The first post-amplification high-frequency signal output from the high-frequency signal output terminal $P_{out}$ and the second post-amplification high-frequency signal passed through the connecting conductor 50 are combined together at a node between the high-frequency signal output terminal $P_{out}$ and the connecting conductor 50. Hereinafter, the resulting high-frequency signal will be referred to as a "composite high-frequency signal". By appropriately adjusting the element values of the matching circuit 30 or of the output matching circuit 240, the first post-amplification high-frequency signal and the second post-amplification high-frequency signal can be accurately phase-matched.

The composite high-frequency signal is passed through the matching circuit 30 and output to the high-frequency signal output terminal $RF_{out}$ of the high-frequency module 10. By being passed through the matching circuit 30, the composite high-frequency signal can be transmitted with low loss to the subsequent-stage circuit connected to the high-frequency signal output terminal $RF_{out}$.

The coupling signal transmitted to the subline 232 is input to the detector circuit 260, which detects the coupling signal and outputs the detected signal from the detected signal output terminal $P_{VDET}$. On the basis of the detected signal, an external control unit (not shown) outputs a control signal to set a bias voltage such that a high-frequency signal is output at a predetermined power level. In the control unit, the amount of adjustment of the bias voltage is set in advance such that the power of the composite high-frequency signal can be determined by a signal obtained from the detected signal (or first post-amplification high-frequency signal), and such that the power of the composite high-frequency signal can be controlled to be maintained at a predetermined level. In accordance with this setting, the control unit outputs a control signal to set the bias voltage.

The control signal is supplied through the bias input terminal $P_{VCTL}$ to the bias setting circuit 250. The bias setting circuit 250 determines the bias voltage on the basis of the control signal, and applies the bias voltage to the former-stage amplifying circuit 211 and the latter-stage amplifying circuit 212.

By performing the feedback control described above, the power of the high-frequency signal (or composite high-frequency signal) output from the high-frequency module 10 can be controlled to be maintained at a desired level.

In this configuration, as seen from the collector of the final-stage transistor 221F, a load on the side of the main line 231 appears to be larger than that on the side of the connecting conductor 50. Therefore, the power level of the second post-amplification high-frequency signal is higher than that of the first post-amplification high-frequency signal.

The second post-amplification high-frequency signal, which passes through only the connecting conductor 50, suffers little loss. The first post-amplification high-frequency signal, which passes through the directional coupler 230, suffers some loss depending on the degree of coupling. As compared to the configuration of the related art where every output signal is the first post-amplification high-frequency signal that passes through only the directional coupler 230, the level of signal power output from the high-frequency module can be higher in the configuration of the present preferred embodiment.

Figure 3A:
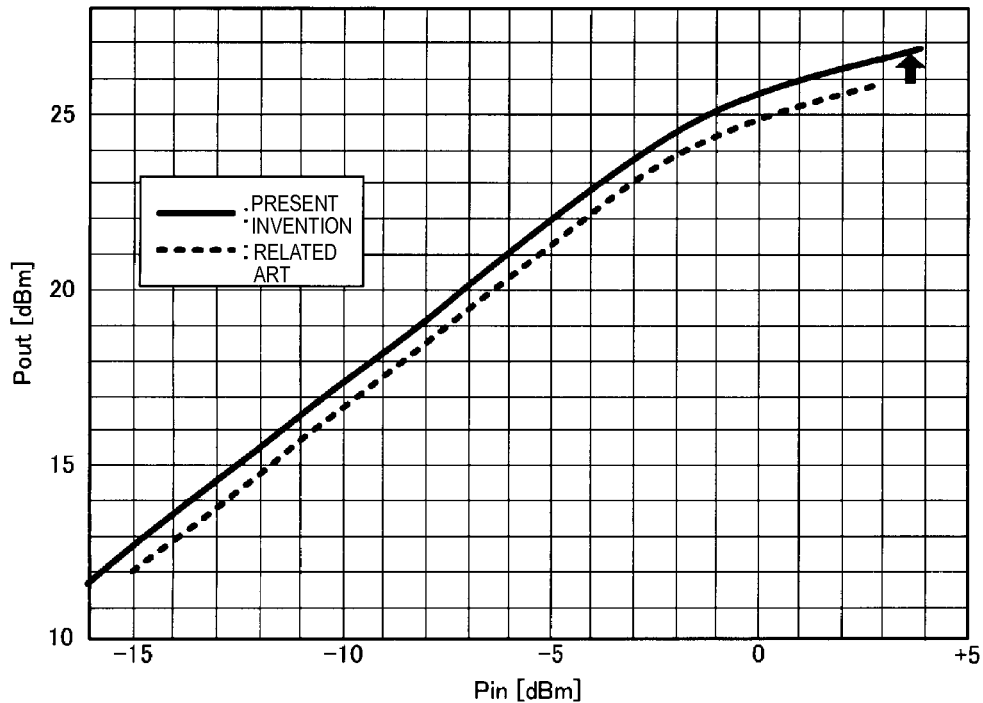
FIG. 3A and FIG. 3B are graphs that compare the high-frequency module of the present preferred embodiment with a high-frequency module of the related art.
Figure 3B:
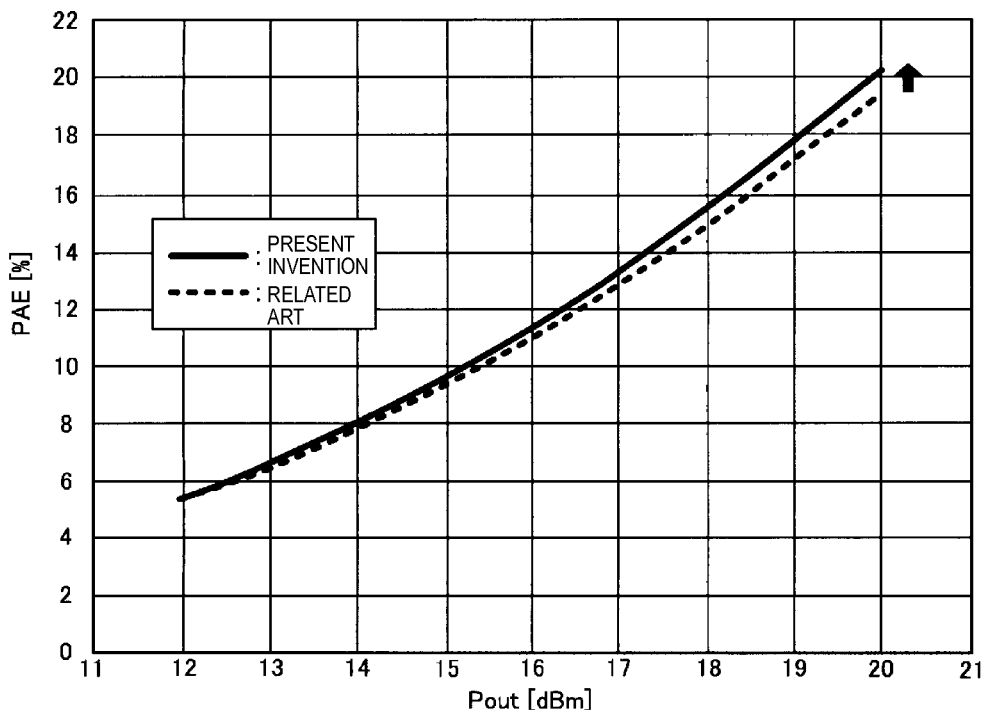

FIG. 3A and FIG. 3B are graphs that compare the high-frequency module 10 of the present preferred embodiment with a high-frequency module of the related art. FIG. 3A is a graph showing characteristics of output power with respect to input power. FIG. 3B is a graph showing characteristics of power added efficiency (PAE) with respect to output power. In FIG. 3A and FIG. 3B, a solid line represents characteristics corresponding to the configuration of the present preferred embodiment, and a broken line represents characteristics corresponding to the configuration of the related art where there is no connecting conductor 50.

As illustrated in FIG. 3A, the level of output power obtained for one level of input power is higher in the configuration of the present preferred embodiment than that in the configuration of the related art. The same applies to any other level of input power. As illustrated in FIG. 3B, the power added efficiency in the configuration of the present preferred embodiment is higher than that in the configuration of the related art.

Figure 4:
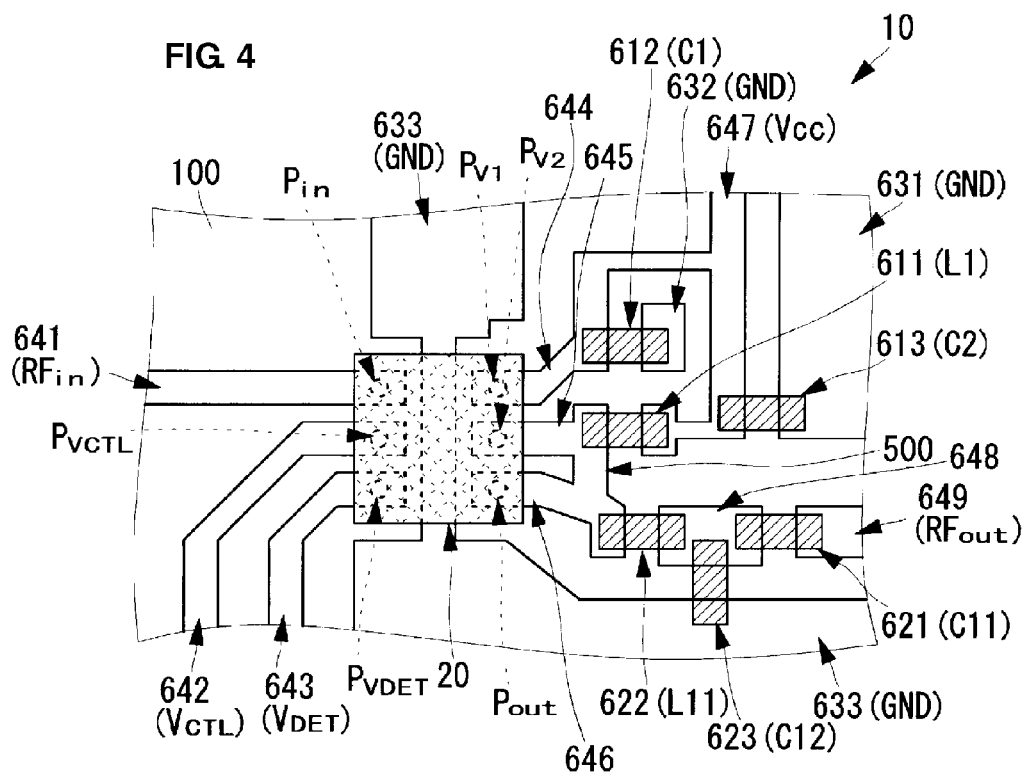
FIG. 4 illustrates a mounting state of the high-frequency module including the power amplifying circuit according to the first preferred embodiment of the present invention.

The high-frequency module 10 described above can be realized by the configuration illustrated in FIG. 4. FIG. 4 illustrates a mounting state of the high-frequency module 10 including the power amplifying circuit according to the first preferred embodiment of the present invention.

The high-frequency module 10 includes a substrate 100 and the high-frequency power amplifying element 20 defined by a package integrated circuit (IC). The substrate 100 is preferably defined by an insulating base. Various electrode patterns (described below) are provided on a surface of the insulating base. The high-frequency power amplifying element 20 is provided with external connection pads which serve as the high-frequency signal input terminal $P_{in}$, the high-frequency signal output terminal $P_{out}$ (corresponding to a "second mounting terminal" of a preferred embodiment of the present invention), the detected signal output terminal $P_{VDET}$, the bias input terminal $P_{VCTL}$, the first driving power-supply voltage application terminal $P_{V1}$, and the second driving power-supply voltage application terminal $P_{V2}$ (corresponding to a "first mounting terminal" of a preferred embodiment of the present invention). The high-frequency signal input terminal $P_{in}$, the detected signal output terminal $P_{VDET}$, and the bias input terminal $P_{VCTL}$ are arranged close to and along a first side of the package IC of the high-frequency power amplifying element 20. The high-frequency signal output terminal $P_{out}$, the first driving power-supply voltage application terminal $P_{V1}$, and the second driving power-supply voltage application terminal $P_{V2}$ are arranged close to and along a second side (opposite the first side) of the package IC of the high-frequency power amplifying element 20. The external connection pads serving as the high-frequency signal output terminal $P_{out}$ and the second driving power-supply voltage application terminal $P_{V2}$ are adjacent to each other.

The surface of the insulating base defining the substrate 100 is preferably provided with linear electrodes 641, 642, 643, 644, 645, 646, 647, 648, and 649 and ground electrodes 631, 632, and 633 having predetermined widths.

One end of each of the linear electrodes 641, 642, 643, 644, 645, and 646 is located at the land of the corresponding external connection pad on the high-frequency power amplifying element 20. The linear electrode 641 having one end at the mounting position of the high-frequency signal input terminal $P_{in}$ extends from the high-frequency power amplifying element 20 to the outside. With this configuration, a high-frequency signal is applied from the linear electrode 641 to the high-frequency signal input terminal $P_{in}$.

The linear electrode 642 having one end at the mounting position of the bias input terminal $P_{VCTL}$ extends from the high-frequency power amplifying element 20 to the outside.

With this configuration, a control signal to set a bias voltage is input from the linear electrode 642 to the bias input terminal $P_{VCTL}$.

The linear electrode 643 having one end at the mounting position of the detected signal output terminal $P_{VDET}$ extends from the high-frequency power amplifying element 20 to the outside. With this configuration, a detected signal from the detected signal output terminal $P_{VDET}$ is output from the linear electrode 643 to the external circuit (control unit).

The linear electrode 644 having one end at the mounting position of the first driving power-supply voltage application terminal $P_{V1}$ extends from the high-frequency power amplifying element 20 to the outside.

The linear electrode 645 having one end at the mounting position of the second driving power-supply voltage application terminal $P_{V2}$ extends from the high-frequency power amplifying element 20 to the outside. The linear electrode 646 having one end at the mounting position of the high-frequency signal output terminal $P_{out}$ extends from the high-frequency power amplifying element 20 to the outside.

The linear electrodes 644, 645, and 646 extend from the high-frequency power amplifying element 20 to the outside and are immediately connected to respective circuit elements (a capacitor element 612, an inductor element 611, and an inductor element 622). The linear electrodes 644, 645, and 646 are short in length to the respective circuit elements.

One end of the linear electrode 647 is located at a predetermined distance from the other end of the linear electrode 645. The linear electrode 647 is connected at a predetermined position to the linear electrode 644. With this configuration, the driving power-supply voltage $V_{cc}$ is applied through the linear electrodes 647 and 644 to the first driving power-supply voltage application terminal $P_{V1}$. The other end of the linear electrode 645 is connected to the one end of the linear electrode 647 by the inductor element 611 (L1). With this configuration, the driving power-supply voltage $V_{cc}$ is applied through the linear electrode 647, the inductor element 611 (L1), and the linear electrode 645 to the second driving power-supply voltage application terminal $P_{V2}$.

The ground electrode 631 is spaced by a predetermined distance from the linear electrode 647. The ground electrode 631 and the linear electrode 647 are connected to each other through a capacitor element 613 (C2).

The ground electrode 632 is spaced by a predetermined distance from the linear electrode 644. The ground electrode 632 and the linear electrode 644 are connected to each other through the capacitor element 612 (C1).

One end of the linear electrode 648 is located at a predetermined distance from the other end of the linear electrode 646. The linear electrode 648 has a length that allows mounting of elements (for example, about three elements in the present preferred embodiment) which are required to be connected to the linear electrode 648. The other end of the linear electrode 646 and the one end of the linear electrode 648 are connected to each other through the inductor element 622 (L11).

One end of the linear electrode 649 is located at a predetermined distance from the other end of the linear electrode 648. The other end of the linear electrode 648 and the one end of the linear electrode 649 are connected to each other through a capacitor element 621 (C11).

The ground electrode 633 is spaced by a predetermined distance from the linear electrodes 646, 648, and 649. The ground electrode 633 and the linear electrode 648 are connected to each other through a capacitor element 623 (C12). The ground electrode 633 preferably has a predetermined shape that includes a bottom surface of the high-frequency power amplifying element 20.

The linear electrode 645 and the linear electrode 646 are connected to each other by a linear electrode 500, which corresponds to a "connecting conductor" of a preferred embodiment of the present invention. The linear electrode 500 is arranged such that a point of connection to the linear electrode 645 and a point of connection to the linear electrode 646 are connected by a straight line. Thus, the linear electrode 645 and the linear electrode 646 are connected by the shortest distance.

With this configuration, the first post-amplification high-frequency signal output from the high-frequency signal output terminal $P_{out}$ is combined with the second post-amplification high-frequency signal output from the second driving power-supply voltage application terminal $P_{V2}$, and the resulting composite high-frequency signal passes through the inductor element 622 (L11), the linear electrode 648, the capacitor element 621, and the linear electrode 649 and is output from the high-frequency signal output terminal $RF_{out}$ of the high-frequency module 10 to the subsequent-stage circuit.

By adopting the mounting and electrode configuration of FIG. 4, the high-frequency module 10 with improved power added efficiency illustrated in the circuit diagram of FIG. 1 can be realized.

Additionally, as described above, the high-frequency signal output terminal $P_{out}$ and the second driving power-supply voltage application terminal $P_{V2}$ of the high-frequency power amplifying element 20 are close to each other, and the linear electrode 646 and the linear electrode 645 connected to the high-frequency signal output terminal $P_{out}$ and the second driving power-supply voltage application terminal $P_{V2}$, respectively, are connected by the linear electrode 500 by the shortest distance. Since this can shorten the transmission path of the second post-amplification high-frequency signal and prevent transmission loss, it is possible to further improve power added efficiency. Since the length of the linear electrode 500 is sufficiently shorter than the wavelengths of the first post-amplification high-frequency signal and the second post-amplification high-frequency signal, there is little need to adjust the phase difference based on the difference in path length occurring when these signals are combined together. The design operation can thus be simplified.

Figure 5:
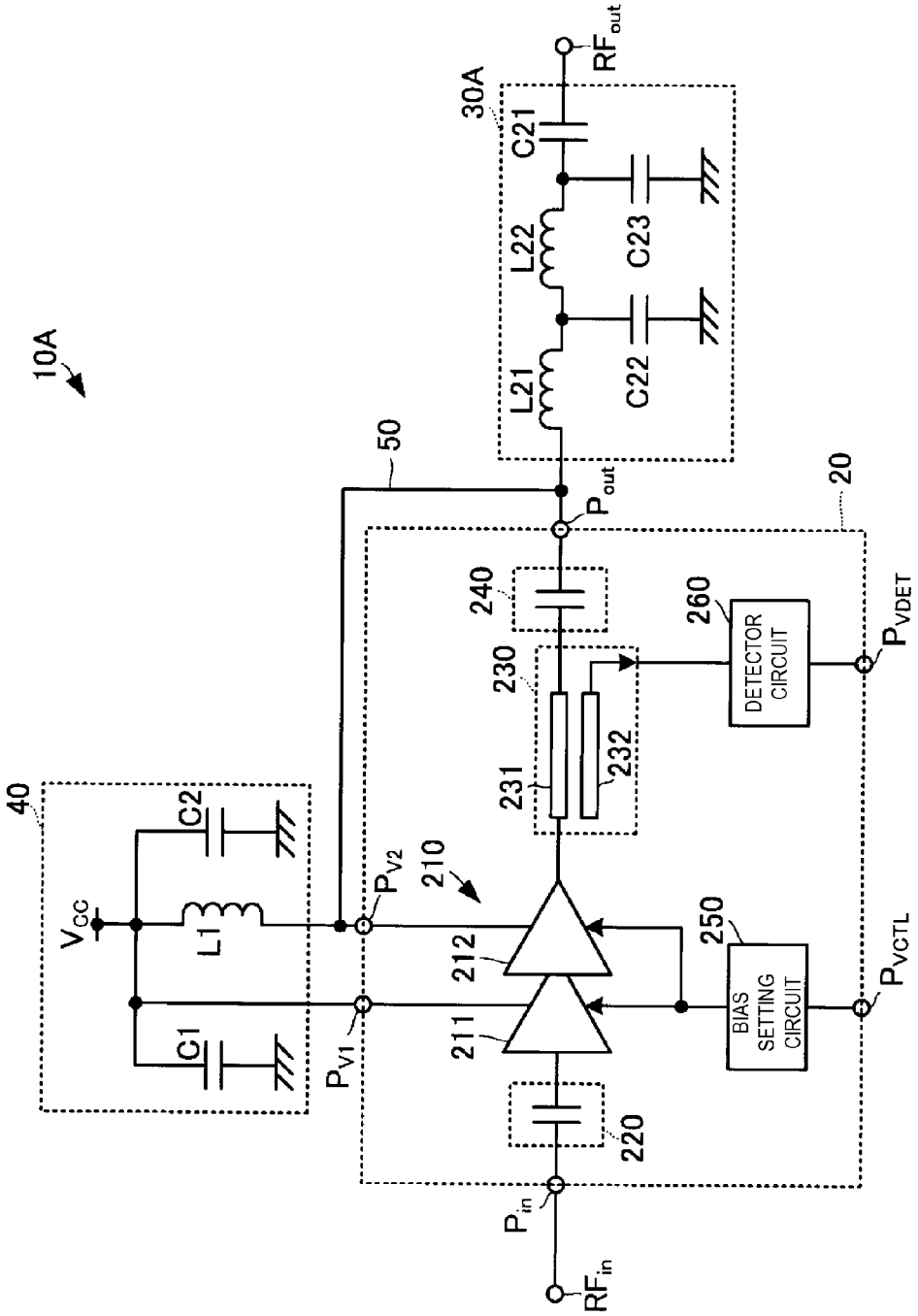
FIG. 5 is a circuit diagram of a high-frequency module including a power amplifying circuit according to a second preferred embodiment of the present invention.

Next, a high-frequency module including a power amplifying circuit according to a second preferred embodiment of the present invention will be described with reference to the drawings. FIG. 5 is a circuit diagram of a high-frequency module 10A including a power amplifying circuit according to the second preferred embodiment of the present invention. The high-frequency module 10A of the present preferred embodiment differs from the high-frequency module 10 of the first preferred embodiment in that the high-frequency module 10A includes a matching circuit 30A instead of the matching circuit 30. The other configurations of the high-frequency module 10A are preferably the same as those of the high-frequency module 10 of the first preferred embodiment, and their description will be omitted.

The matching circuit 30A corresponds to a "first matching circuit" of a preferred embodiment of the present invention. The matching circuit 30A includes inductors L21 and L22 and capacitors C21, C22, and C23. The inductors L21 and L22 and the capacitor C21 are connected in series between the high-frequency signal output terminal $P_{out}$ of the high-frequency power amplifying element 20 and the high-frequency signal output terminal $RF_{out}$ of the high-frequency module 10A. A node between the inductor L21 and the inductor L22 is grounded through the capacitor C22. A node between the inductor L22 and the capacitor C21 is grounded through the capacitor C23.

With this configuration, the number of elements to be impedance-matched is larger than that in the matching circuit 30 of the first preferred embodiment. This can expand the range of impedances that can be matched. Thus, even when the high-frequency power amplifying element 20 is an multi-band power amplifier (PA) capable of amplifying high-frequency signals in a wide frequency range, impedance matching between the high-frequency power amplifying element 20 and the subsequent-stage circuit can be performed with a high degree of accuracy.

Although the high-frequency power amplifying element 20 is preferably realized by a package IC in the example described above, the high-frequency power amplifying element 20 may be realized by a gallium arsenide (GaAs) bare chip monolithic microwave integrated circuit (MMIC) or a silicon-germanium (SiGe) bare chip MMIC, for example. In this case, the high-frequency power amplifying element 20 defined by a bare chip can be connected to a substrate by wire bonding or by forming solder bumps and mounting them face down.

The high-frequency amplifying circuit 210, the input matching circuit 220, the directional coupler 230, the output matching circuit 240, the bias setting circuit 250, and the detector circuit 260 included in the high-frequency power amplifying element 20 may be included on a single chip or separate chips, or may be manufactured by different processes. For example, these elements may be manufactured by a combination of a GaAs process, an SiGe process, and a silicon (Si) process.

The matching circuit 30 or 30A is preferably defined by linear electrodes and mounted components in the example described above. Alternatively, the matching circuit 30 or 30A may be defined by an integrated passive device (IPD) manufactured, for example, by a GaAs process, an SiGe process, or an Si process.

The substrate 100 may be a low-temperature co-fired ceramic (LTCC) substrate. Some or all of the components of the matching circuit 30 or 30A may be provided within the substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A power amplifying circuit comprising:
a high-frequency amplifying circuit configured to amplify an input high-frequency signal by a predetermined amplification factor and output an amplified high-frequency signal;
a directional coupler including a main line connected at a first end thereof to an output terminal of the high-frequency amplifying circuit and connected at a second end thereof to a signal output terminal; and
a connecting conductor configured to bypass the directional coupler and connect the output terminal of the high-frequency amplifying circuit to the signal output terminal; wherein
the high-frequency amplifying circuit includes a final-stage amplifying element that includes a driving power-supply voltage application terminal that is directly connected to the output terminal of the high-frequency amplifying circuit; and
a first end of the connecting conductor is connected to the driving power-supply voltage application terminal.

2. The power amplifying circuit according to claim 1, further comprising a first matching circuit connected to the second end of the main line.

3. The power amplifying circuit according to claim 2, further comprising a second matching circuit connected between the second end of the main line and a node between the second end of the main line and the connecting conductor.

4. The power amplifying circuit according to claim 2, wherein the first matching circuit includes a first capacitor connected in series to a signal transmission line.

5. The power amplifying circuit according to claim 4, wherein the first matching circuit includes an inductor connected in series to the first capacitor, and a second capacitor connected between a ground potential and a node between the first capacitor and the inductor.

6. The power amplifying circuit according to claim 1, wherein the directional coupler further includes a subline, and the main line and the subline are arranged to be electromagnetically coupled to each other with a predetermined degree of coupling at a frequency of the amplified high-frequency signal.

7. The power amplifying circuit according to claim 6, further comprising
a detector circuit; wherein
a first end of the subline is connected to a ground potential and a second end of the subline is connected to the detector circuit.

8. The power amplifying circuit according to claim 1, further comprising a bias setting circuit connected to the high-frequency amplifying circuit.

9. A high-frequency module comprising:
a high-frequency power amplifying element including a high-frequency amplifying circuit configured to amplify an input high-frequency signal by a predetermined amplification factor and output an amplified high-frequency signal; and
a substrate on which the high-frequency power amplifying element is mounted; wherein
the high-frequency power amplifying element includes:
a directional coupler including a main line connected at a first end thereof to an output terminal of the high-frequency amplifying circuit and connected at a second end thereof to a signal output terminal of the high-frequency power amplifying element;
a first mounting terminal that applies a driving power-supply voltage to the high-frequency amplifying circuit; and
a second mounting terminal defining the signal output terminal; and
the substrate includes:
a connecting conductor configured to connect the first mounting terminal to the second mounting terminal; wherein
the connecting conductor is configured to bypass the directional coupler and connect the output terminal of the high-frequency amplifying circuit to the signal output terminal;
the high-frequency amplifying circuit includes a final-stage amplifying element that includes a driving power-supply voltage application terminal that is directly connected to the output terminal of the high-frequency amplifying circuit; and
a first end of the connecting conductor is connected to the driving power-supply voltage application terminal.

10. The high-frequency module according to claim 9, wherein the first mounting terminal and the second mounting terminal are adjacent to each other in the high-frequency power amplifying element; and the connecting conductor that connects the first mounting terminal to the second mounting terminal is substantially linear.

11. The high-frequency module according to claim 9, further comprising a first matching circuit connected to the second end of the main line.

12. The high-frequency module according to claim 11, further comprising a second matching circuit connected between the second end of the main line and a node between the second end of the main line and the connecting conductor.

13. The high-frequency module according to claim 11, wherein the first matching circuit includes a first capacitor connected in series to a signal transmission line.

14. The high-frequency module according to claim 13, wherein the first matching circuit includes an inductor connected in series to the first capacitor, and a second capacitor connected between a ground potential and a node between the first capacitor and the inductor.

15. The high-frequency module according to claim 9, wherein the directional coupler further includes a subline, and the main line and the subline are arranged to be electromagnetically coupled to each other with a predetermined degree of coupling at a frequency of the amplified high-frequency signal.

16. The high-frequency module according to claim 15, further comprising:

a detector circuit; wherein a first end of the subline is connected to a ground potential and a second end of the subline is connected to the detector circuit.

17. The high-frequency module according to claim 9, further comprising a bias setting circuit connected to the high-frequency amplifying circuit.

\* \* \* \* \*